US009344044B2

(12) United States Patent
Yoshizaki

(10) Patent No.: US 9,344,044 B2
(45) Date of Patent: May 17, 2016

(54) HIGH-FREQUENCY POWER AMPLIFIER

(71) Applicant: Murata Manufacturing Co., Ltd., Kyoto (JP)

(72) Inventor: Yasunobu Yoshizaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/451,506

(22) Filed: Aug. 5, 2014

(65) Prior Publication Data

US 2015/0054587 A1 Feb. 26, 2015

(30) Foreign Application Priority Data

Aug. 26, 2013 (JP) ................................. 2013-174548

(51) Int. Cl.

| H03F 3/45 | (2006.01) |
|---|---|
| H03F 3/21 | (2006.01) |
| H03F 3/19 | (2006.01) |
| H03F 1/02 | (2006.01) |
| H03F 1/32 | (2006.01) |
| H03F 1/56 | (2006.01) |
| H03F 3/195 | (2006.01) |
| H03F 3/24 | (2006.01) |
| H03F 3/68 | (2006.01) |
| H03F 3/72 | (2006.01) |

(52) U.S. Cl.
CPC ............... *H03F 1/0261* (2013.01); *H03F 1/32* (2013.01); *H03F 1/56* (2013.01); *H03F 3/195* (2013.01); *H03F 3/245* (2013.01); *H03F 3/68* (2013.01); *H03F 3/72* (2013.01); *H03F 2200/111* (2013.01); *H03F 2200/21* (2013.01); *H03F 2200/222* (2013.01); *H03F 2200/387* (2013.01); *H03F 2200/429* (2013.01); *H03F 2200/432* (2013.01); *H03F 2200/451* (2013.01)

(58) Field of Classification Search
USPC .................................. 330/285, 296–297, 289
See application file for complete search history.

(56) References Cited

U.S. PATENT DOCUMENTS

| 6,624,702 | B1 * | 9/2003 | Dening ................. H03F 1/0233 330/285 |
|---|---|---|---|
| 7,332,966 | B2 | 2/2008 | Furuya et al. |
| 2006/0214729 | A1 | 9/2006 | Furuya et al. |

(Continued)

FOREIGN PATENT DOCUMENTS

| JP | H10-290129 A | 10/1998 |
|---|---|---|
| JP | 2001-274645 A | 10/2001 |
| JP | 2005-197904 A | 7/2005 |
| JP | 2006-270146 A | 10/2006 |
| JP | 2011-182018 A | 9/2011 |

(Continued)

*Primary Examiner* — Hieu Nguyen
(74) *Attorney, Agent, or Firm* — Pearne & Gordon LLP

(57) ABSTRACT

The present invention provides a power amplifier that can reduce irregularities in characteristics such as gains. A high-frequency power amplifier that is used for a mobile communication terminal includes: an amplifier element that includes a composite semiconductor bipolar transistor and that amplifies high-frequency power of a predetermined frequency band with a bias voltage and a bias current supplied thereto; a bias circuit that supplies the bias voltage and the bias current to the amplifier element on the basis of a bias reference voltage; a bias reference voltage supply circuit that generates and supplies the bias reference voltage to the bias circuit; and a bias reference voltage control unit that controls the bias reference voltage supply circuit so as to generate the bias reference voltage of a voltage corresponding to a given signal.

19 Claims, 10 Drawing Sheets

(56) References Cited

U.S. PATENT DOCUMENTS

2011/0210795 A1 9/2011 Ohta et al.
2014/0347130 A1 11/2014 Iijima

FOREIGN PATENT DOCUMENTS

| JP | 2013-131891 A | 7/2013 |
| WO | 2013/094415 A1 | 6/2013 |

* cited by examiner

HIGH-FREQUENCY POWER AMPLIFIER

BACKGROUND OF THE INVENTION

1. Field of the Invention

The present invention relates to a high-frequency power amplifier, and more particularly, to a high-frequency power amplifier for a mobile communication terminal.

2. Background Art

A mobile communication terminal (for example, a mobile phone) employs a high-frequency power amplifier (power amplifier) so as to output high-frequency power having a magnitude large enough to cause RF waves to arrive at a communication partner (for example, a base station).

[Patent Document 1] Japanese Patent Application Laid-Open No. 2011-182018

BRIEF SUMMARY OF THE INVENTION

A power amplifier includes an amplifier element such as a transistor. Such an amplifier element operates on the basis of a bias (a bias voltage and a bias current) received (for example, see Patent Document 1).

When power amplifiers are mass-produced, characteristics such as gains of the power amplifiers are irregular even with the same bias due to individual differences (irregularities) of amplifier elements included therein.

Since a designer and a manufacturer of mobile communication terminals and the like should consider such irregularities in characteristics such as gains of the power amplifiers, it is more difficult to design or manufacture the mobile communication terminals with larger irregularities.

An object of the present invention is to provide a power amplifier that can reduce irregularities in characteristics such as gains.

According to an aspect of the present invention, there is provided a high-frequency power amplifier that is used for a mobile communication terminal and that includes: an amplifier element that includes a composite semiconductor bipolar transistor and that amplifies high-frequency power of a predetermined frequency band with a bias voltage and a bias current supplied thereto; a bias circuit that supplies the bias voltage and the bias current to the amplifier element on the basis of a bias reference voltage; a bias reference voltage supply circuit that generates and supplies the bias reference voltage to the bias circuit; and a bias reference voltage control unit that controls the bias reference voltage supply circuit so as to generate the bias reference voltage of a voltage corresponding to a given signal.

According to the present invention, it is possible to reduce irregularities in characteristics such as gains of the power amplifiers.

DETAILED DESCRIPTION

Figure 1:
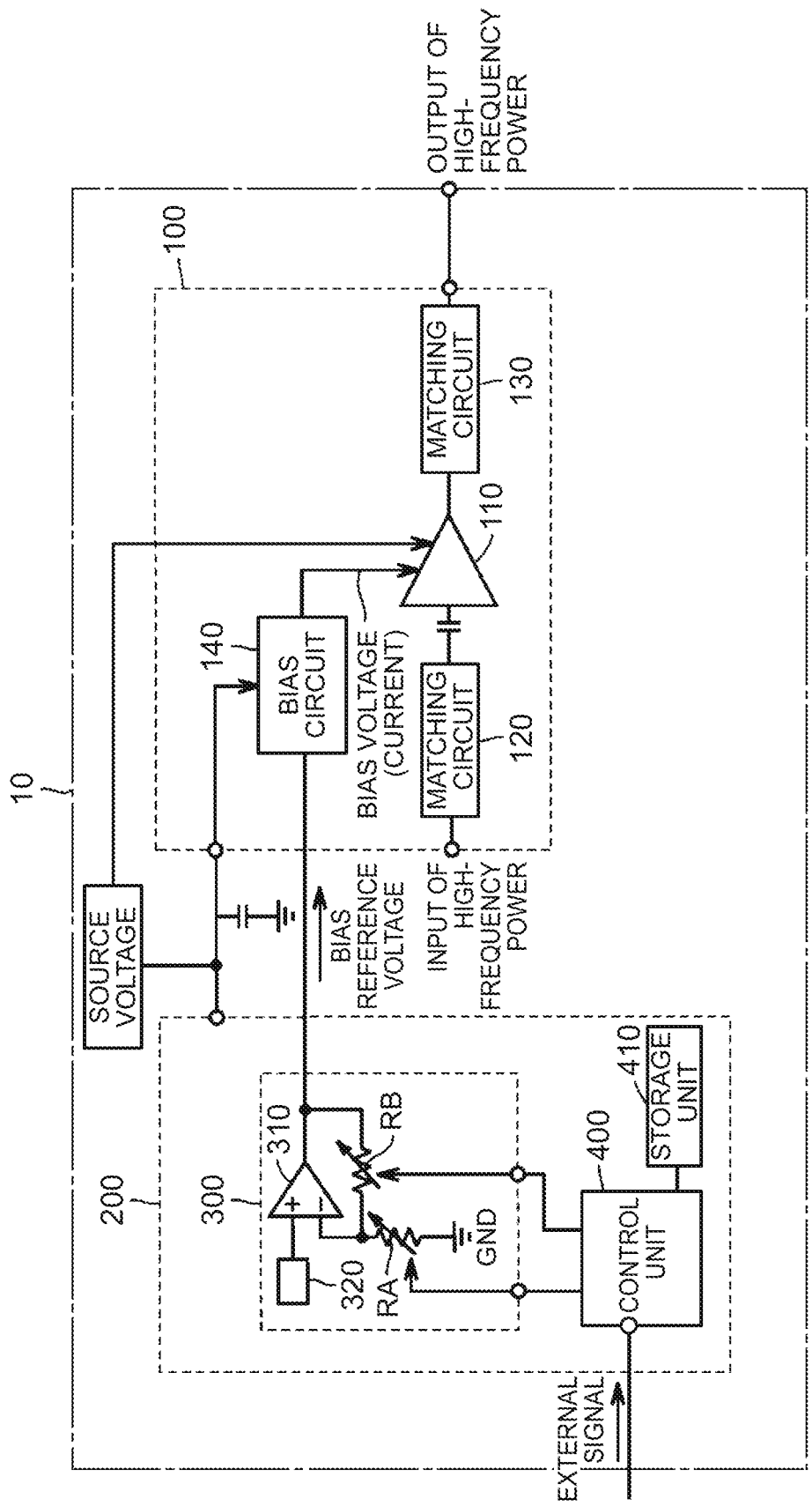
FIG. 1 is a diagram schematically illustrating a configuration of a power amplifier according to an embodiment of the present invention.

Hereinafter, embodiments of the present invention will be described in detail with reference to the accompanying drawings. Identical or corresponding elements in the drawings will be referenced by like reference numerals and description thereof will not be repeated.

FIG. 1 is a diagram schematically illustrating a configuration of a power amplifier according to an embodiment of the present invention.

Referring to FIG. 1, the power amplifier 10 primarily includes a high-frequency amplifier unit 100 and a control IC 200. That is, the power amplifier 10 is a power amplifier module (PAM) in which the high-frequency amplifier unit 100 and the control IC 200 are made into a module.

The high-frequency amplifier unit 100 includes an amplifier element 110, a matching circuit 120, a matching circuit 130, and a bias circuit 140. The amplifier element 110 includes composite semiconductor bipolar transistor (e.g. a hetero-junction bipolar transistor (HBT)). The matching circuit 120 is an impedance matching circuit that is disposed on the input side of the amplifier element 110. The matching circuit 130 is an impedance matching circuit that is disposed on the output side of the amplifier element 110. The bias circuit 140 supplies a bias voltage and a bias current to the amplifier element 110. Radio frequency (RF) power is input to the matching circuit 120, is amplified by the amplifier element 110, and is then output from the matching circuit 130.

The bias circuit 140 supplies the bias voltage and the bias current to the amplifier element 110 on the basis of a bias reference voltage supplied from a bias reference voltage supply circuit 300 to be described later. Specifically, the bias circuit 140 is an emitter follower circuit that supplies a voltage, which is lower by a predetermined voltage (base-emitter voltage) than the bias reference voltage, as a base voltage of the amplifier element 110 to the amplifier element 110 along with a base current.

Accordingly, the high-frequency amplifier unit 100 can optimally amplify high-frequency power in a predetermined frequency range. For example, one of a 900 MHz band and a 2 GHz band may be selected as the predetermined frequency range.

The control IC 200 includes a bias reference voltage supply circuit 300, a control unit 400, and a storage unit 410. The bias reference voltage supply circuit 300 generates and supplies a bias reference voltage to the bias circuit 140. The control unit 400 controls the magnitude of the bias reference voltage generated by the bias reference voltage supply circuit 300. The storage unit 410 stores information on the bias reference voltage.

The bias reference voltage supply circuit 300 includes an operational amplifier 310, a band-gap reference voltage supply circuit 320, a resistor RA, and a resistor RB. The operational amplifier 310 includes a non-inverted input terminal (+) and an inverted input terminal (−) and outputs the bias reference voltage. The band-gap reference voltage supply circuit 320 supplies a reference voltage to the non-inverted input terminal (+) of the operational amplifier 310. The resistor RA connects the inverted input terminal (−) of the operational amplifier 310 to the ground terminal GND. The resistor RB connects the inverted input terminal (−) of the operational amplifier 310 to the output terminal. In FIG. 1, the resistor RA and the resistor RB are both variable resistors, but one or both resistors thereof may be a fixed resistor.

The control unit 400 changes (controls) the resistance value of the resistor RA and/or the resistor RB. When the resistance value of the resistor RA and/or the resistor RB is changed, the gain of the operational amplifier 310 is changed and thus the output voltage of the operational amplifier 310 is also changed. That is, the control unit 400 controls the bias reference voltage output from the operational amplifier 310.

The control unit 400 is configured to be communicable with the outside of the power amplifier 10 and controls the bias reference voltage on the basis of a signal from the outside (external signal). The external signal may directly indicate the voltage value of the bias reference voltage or may indicate discrete values (for example, 0 to 31 or 0 to 63) corresponding to a control range (variable range) of the bias reference voltage. The external signal may be an analog signal or a digital signal.

Accordingly, the control IC 200 can generate a desired bias reference voltage on the basis of the signal from the outside and can supply the generated bias reference voltage to the bias circuit 140.

Another voltage or current used for the high-frequency amplifier unit 100 or the control IC 200 is supplied on the basis of a source voltage.

By employing this configuration, the bias reference voltage in the power amplifier 10 can be controlled and the bias of the amplifier element 110 can be set to a desired value. When the bias reference voltage varies, the gain of the amplifier element 110 (that is, the gain of the power amplifier 10) also varies.

Figure 2:
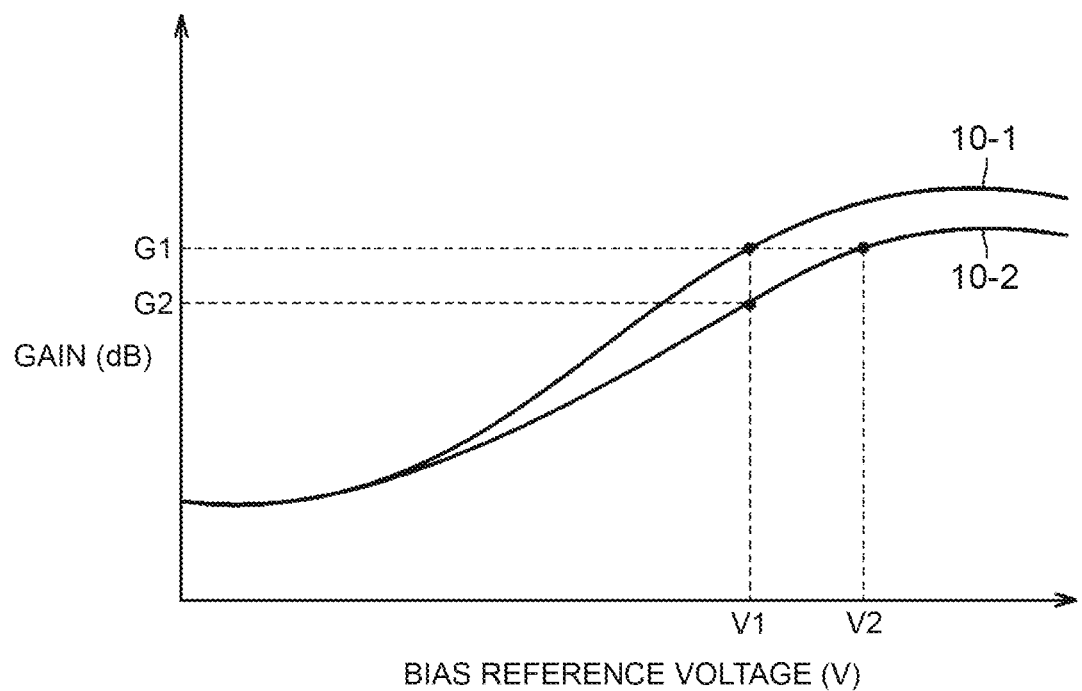
FIG. 2 is a graph illustrating an example of a relationship between a bias reference voltage and a gain of a power amplifier.

FIG. 2 is a graph illustrating an example of a relationship between the bias reference voltage and the gain of the power amplifier 10 illustrated in FIG. 1. Referring to FIG. 2, two curves 10-1 and 10-2 in the graph represent the relationships between the bias reference voltage and the gain in two power amplifiers having the same design. Since the two power amplifiers have irregularity therebetween, the two curves 10-1 and 10-2 do not completely match each other. When the bias reference voltage increases, the gain substantially tends to increase. On the other hand, when the bias reference voltage decreases, the gain substantially tends to decrease.

Here, when both bias reference voltages of the two power amplifiers are set to V1, the gains are G1 and G2, respectively. G1 and G2 are different from each other (that is, the gain is irregular). In order to remove the irregularity in gain, the bias reference voltage of the power amplifier 10-2 can be set to V2. Accordingly, the gains of the two power amplifiers are both G1. Both gains may match each other by changing the bias reference voltage of the power amplifier 10-1 instead of changing the bias reference voltage of the power amplifier 10-2.

In order to match the gains with each other, a signal indicating what bias reference voltages are used in the power amplifiers is given as the external signal illustrated in FIG. 1 to the control unit 400. Alternatively, in each power amplifier, the bias reference voltage (data in which the gain and the bias reference voltage are correlated with each other) of which the gain has a predetermined value may be stored in the storage unit 410 in advance. The control unit 400 can control the bias reference voltage by receiving the data as a data signal from the storage unit 410.

In this way, according to the embodiment of the present invention, since the bias reference voltages of the power amplifiers can be individually set, it is possible to match the gains of the power amplifiers with each other and to reduce the irregularity therebetween.

In an embodiment of the present invention, it may be possible to reduce a distortion (ACLR: Adjacent Channel Leakage Ratio) of the transmission output of the power amplifier.

Figure 3:
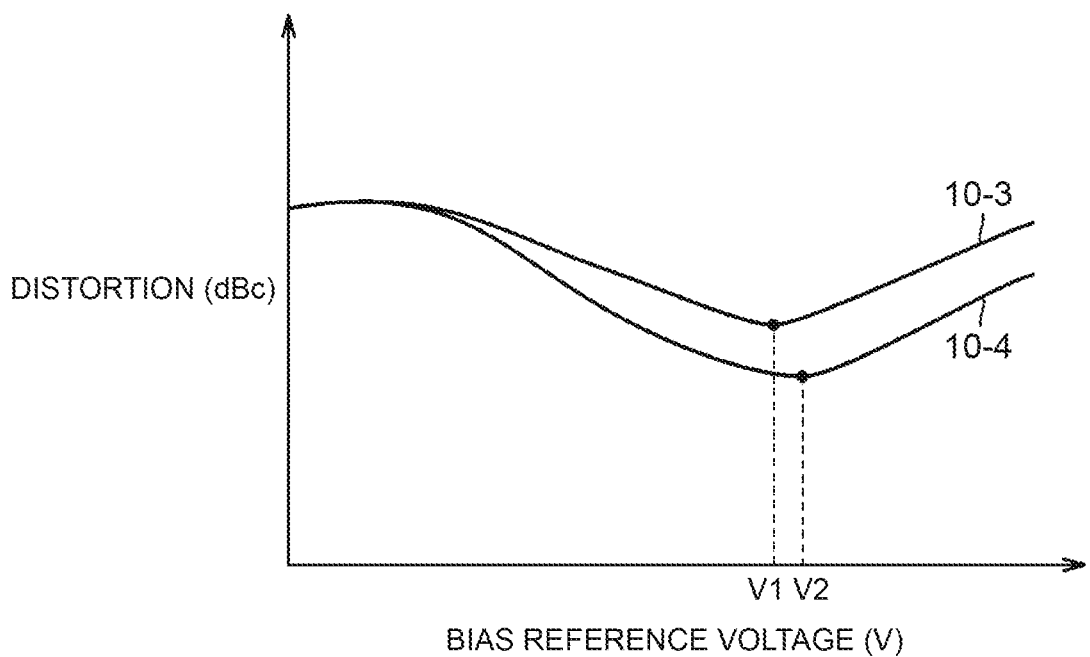
FIG. 3 is a graph illustrating an example of a relationship between a bias reference voltage and a distortion of a power amplifier.

FIG. 3 is a graph illustrating an example of a relationship between a bias reference voltage of a power amplifier and a distortion. Referring to FIG. 3, two curves 10-3 and 10-4 in the graph represent the relationships between the bias reference voltage and the distortion in two power amplifiers having the same design, respectively. Since the two power amplifiers have irregularity, the two curves 10-3 and 10-4 do not completely match each other.

It is preferable that the distortion in a power amplifier be smaller. Accordingly, in the power amplifier 10-3, the bias reference voltage can be set to V1 at which the distortion is the minimum. On the other hand, in the power amplifier 10-4, the bias reference voltage can be set to V2 at which the distortion is the minimum.

Information on the bias reference voltage having the minimum distortion such as V1 and V2 may be given as an external signal to the control unit 400 or may be stored in the storage unit 410 in advance.

A power-added efficiency (PAE) of a power amplifier also varies depending on the bias reference voltage. Accordingly, according to the embodiment of the present invention, it is possible to improve the power-added efficiency by controlling the bias reference voltage.

[Modification of Bias Reference Voltage Supply Circuit]

Figure 4:
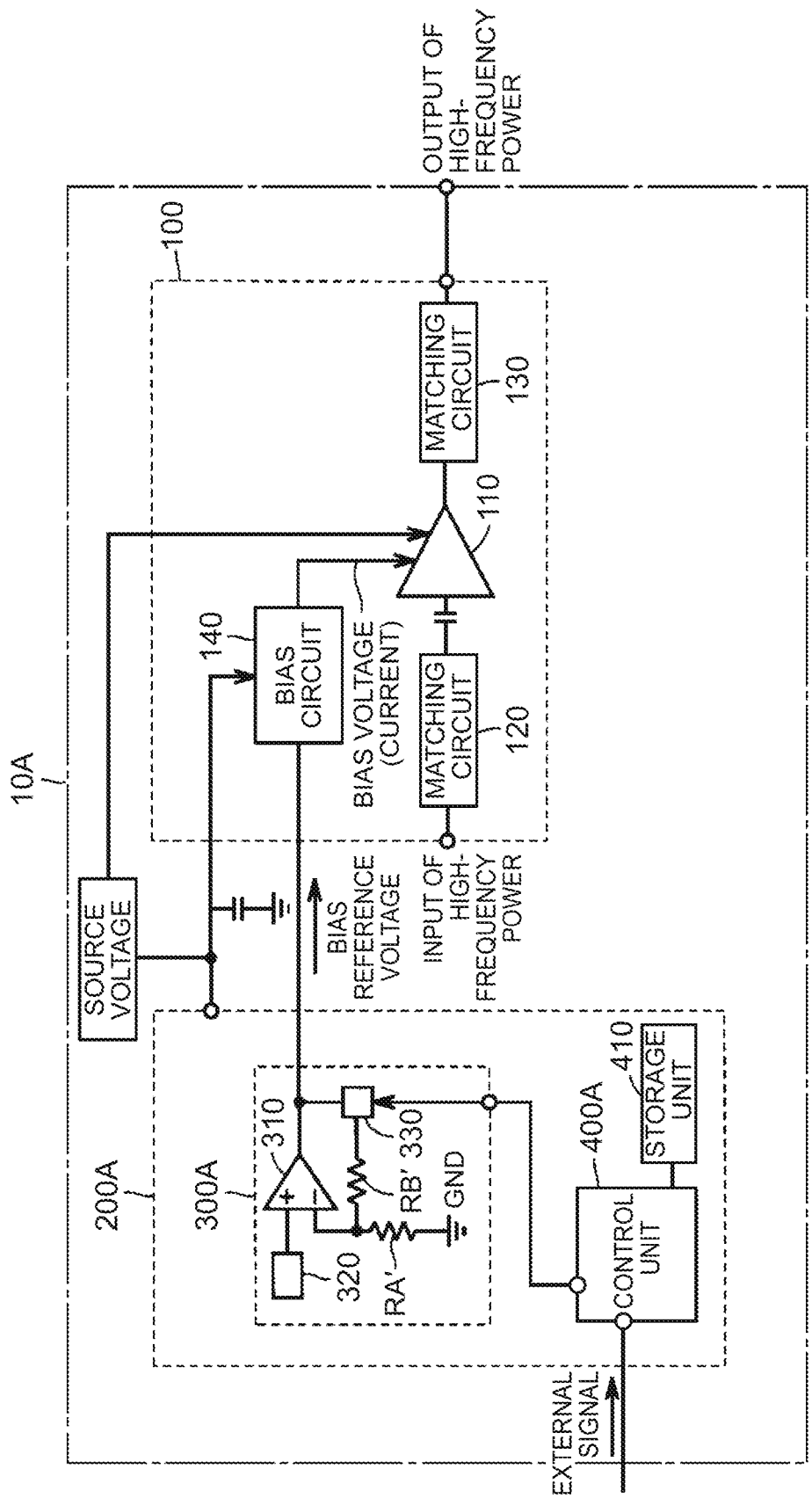
FIG. 4 is a diagram schematically illustrating a configuration of a power amplifier according to a modification example of a bias reference voltage supply circuit 300.

FIG. 4 is a diagram schematically illustrating a configuration of a power amplifier according to a modification of the bias reference voltage supply circuit 300 illustrated in FIG. 1. A power amplifier 10A illustrated in FIG. 4 has basically the same configuration as the power amplifier 10 illustrated in FIG. 1, except that it includes a control IC 200A. The description of the same elements will not be repeated.

The control IC 200A includes a bias reference voltage supply circuit 300A, a control unit 400A, and a storage unit 410.

The bias reference voltage supply circuit 300A has basically the same configuration as the bias reference voltage supply circuit 300 illustrated in FIG. 1, except that it includes a resistor circuit 330. The description of the same elements will not be repeated. The control unit 400A controls the resistor circuit 330.

Referring to FIG. 4, the resistor circuit 330 is disposed between the output terminal of the operational amplifier 310 and the resistor RB. The resistor circuit 330 can be considered as a resistor (added resistor) added to the resistor RB.

Figure 5:
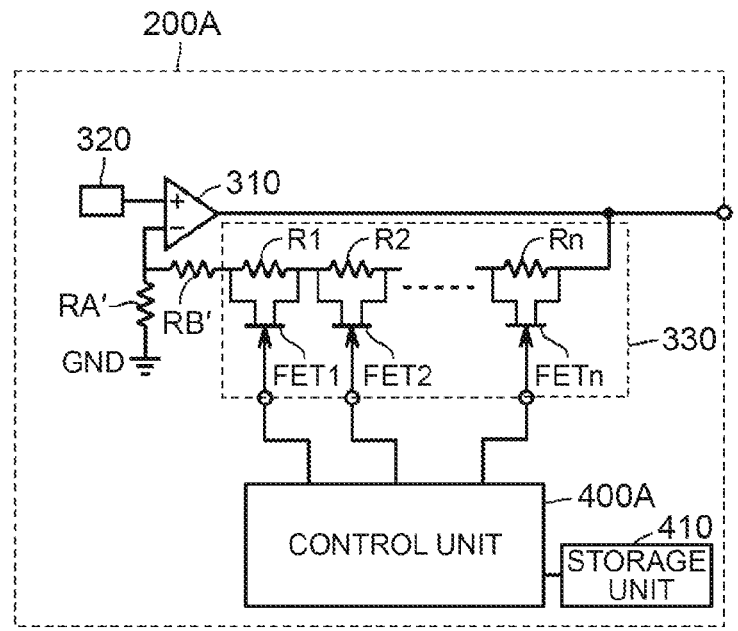
FIG. 5 is a diagram illustrating a detailed configuration of a part relevant to a resistor circuit 330 and a control unit 400A.

FIG. 5 is a diagram illustrating a detailed configuration of a part relevant to the resistor circuit 330 and the control unit 400A.

Referring to FIG. 5, in the resistor circuit 330, n resistors from resistor R1 to a resistor Rn are connected in series. Field effect transistors (FETs) FET1 to FETn are connected as a bypass switch in parallel to the resistors, respectively. Specifically, the drain terminal of the transistor FET1 is connected to an end of the resistor R1, and the source terminal of the transistor FET1 is connected to the other end of the resistor R1. By applying a voltage to the gate terminal of the transistor FET1, the resistor R1 is bypassed. The same is true of the resistors R2 to Rn.

The gate terminals of the transistors FET1 to FETn are connected to the control unit 400A. The control unit 400A individually controls applications of a voltage to the gate terminals of the transistors FET1 to FETn.

By employing this configuration, the control IC 200A can gradually change the resistance value of the resistor circuit 330 to control the output voltage (that is, the bias reference voltage) of the operational amplifier 310.

It may be desirable that the magnitudes of the resistors R1 to Rn be determined on the basis of a geometric series with a geometric ratio of r=2. In the geometric series, for example, the resistance value of the resistor R1 is set as the first term and the resistance value can be designed to increase in the order of the resistors R2 to Rn. Accordingly, it is possible to change the resistance value of the resistor circuit 330 at regular intervals and implement the resistor circuit 330 with a small number of elements. The number n of resistors and FETs may be set to n=5 or n=6. In this case, since the bias reference voltage is controlled by 5 bits or 6 bits, the gain of the power amplifier 10A can be very finely adjusted.

When n=5 or n=6 is set, the circuit scale of the resistor circuit 330 does not increase much. The suppression in circuit scale is a merit of the power amplifier for a mobile communication terminal requiring a decrease in size.

The resistor circuit 330 may be an added resistor of the resistor RA instead of, or in addition to, the added resistor of the resistor RB. In this case, the resistor circuit 330 is connected in series to the resistor RA.

In this way, in the bias reference voltage supply circuit 300A illustrated in FIG. 4, it is possible to more finely control the bias reference voltage of the power amplifier than that in the bias reference voltage supply circuit 300 illustrated in FIG. 1. Accordingly, it is possible to more accurately adjust (match) the gains of the power amplifiers.

[Power Amplifier Having Multi-Stage Structure]

Figure 6:
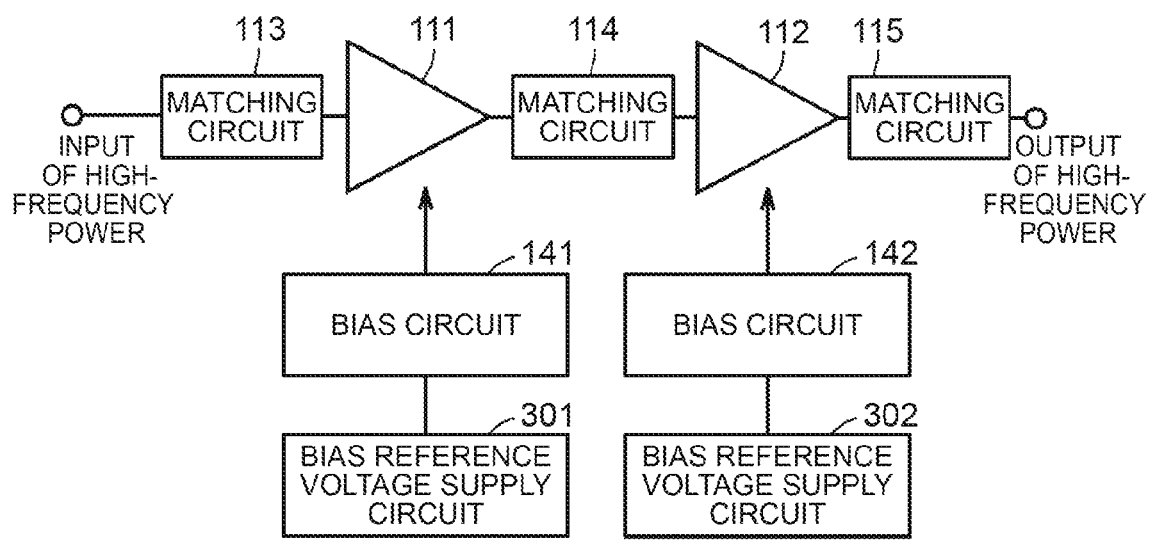
FIG. 6 is a diagram illustrating a part of a power amplifier having a multi-stage structure.

The amplifier unit of the power amplifier may be configured to have a multi-stage structure so as to acquire a larger gain. FIG. 6 is a diagram illustrating a part of the power amplifier having a multi-stage structure.

As illustrated in FIG. 6, RF power is amplified by an amplifier element 111 of the front stage and an amplifier element 112 of the rear stage. Each of the amplifier element 111 and the amplifier element 112 may include a composite semiconductor bipolar transistor, similarly to the amplifier element 110 illustrated in FIG. 1.

An input side of the amplifier element 111 is provided with a matching circuit 113. A matching circuit 114 is disposed between the amplifier element 111 and the amplifier element 112. An output side of the amplifier element 112 is provided with a matching circuit 115.

A bias circuit 141 supplies a bias voltage and a bias current to the amplifier element 111 on the basis of the bias reference voltage supplied from a bias reference voltage supply circuit 301 to be described later. A bias circuit 142 supplies a bias voltage and a bias current to the amplifier element 112 on the basis of the bias reference voltage supplied from a bias reference voltage supply circuit 302 to be described later. The bias circuit 141 and the bias circuit 142 may be an emitter follower circuit, similarly to the bias circuit 140 illustrated in FIG. 1.

The bias reference voltage supply circuit 301 and the bias reference voltage supply circuit 302 have the same configuration as the bias reference voltage supply circuit 300 illustrated in FIG. 1.

That is, the power amplifier having a multi-stage structure includes an amplification stage of the front stage and an amplification stage of the rear stage. The amplification stage of the front stage includes the amplifier element 111, the bias circuit 141, and the bias reference voltage supply circuit 301. The amplification stage of the rear stage includes the amplifier element 112, the bias circuit 142, and the bias reference voltage supply circuit 302.

The bias reference voltages generated by the bias reference voltage supply circuit 301 and the bias reference voltage supply circuit 302 are individually controlled by the control unit 400. Accordingly, the control unit 400 can individually control the bias voltages and the bias currents supplied to the amplifier element 111 and the amplifier element 112.

[Experiment Data]

Hereinafter, variations in characteristics of a power amplifier having a multi-stage structure illustrated in FIG. 6 when the bias reference voltage of the power amplifier is controlled by 6 bits will be described with reference to experiment data (FIGS. 7 to 14). The values of 0 to 63 corresponding to the 6-bit control are referred to as "DAC values" in this specification.

Figure 7:
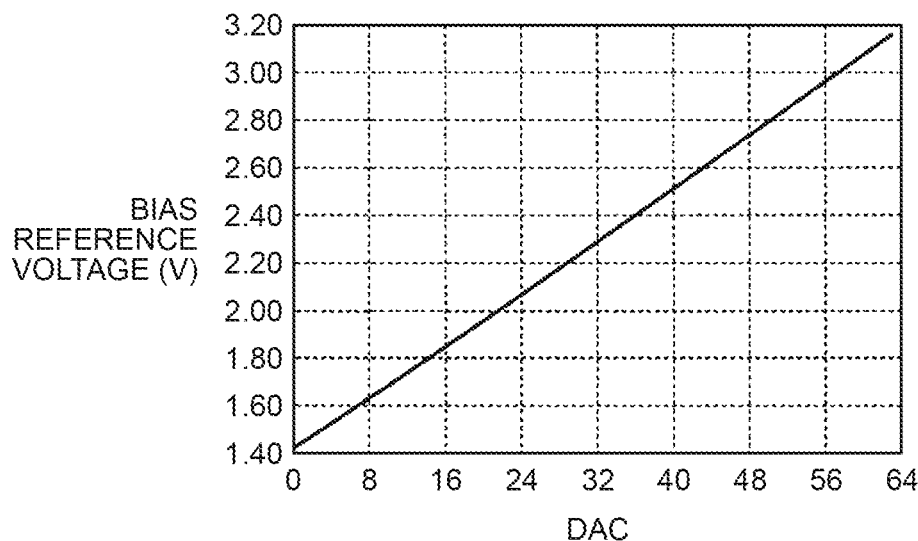
FIG. 7 is a graph illustrating a relationship between a DAC value and a bias reference voltage supplied to a bias circuit 141.

FIG. 7 is a graph illustrating a relationship between the DAC value and the bias reference voltage supplied to the bias circuit 141 (the bias reference voltage of the front stage). As illustrated in FIG. 7, when the DAC value is in the range of 0 to 63, the bias reference voltage linearly varies between 1.43 V and 3.16 V. In this case, the bias reference voltage is controlled at intervals of about 27.0 mV.

Figure 8:
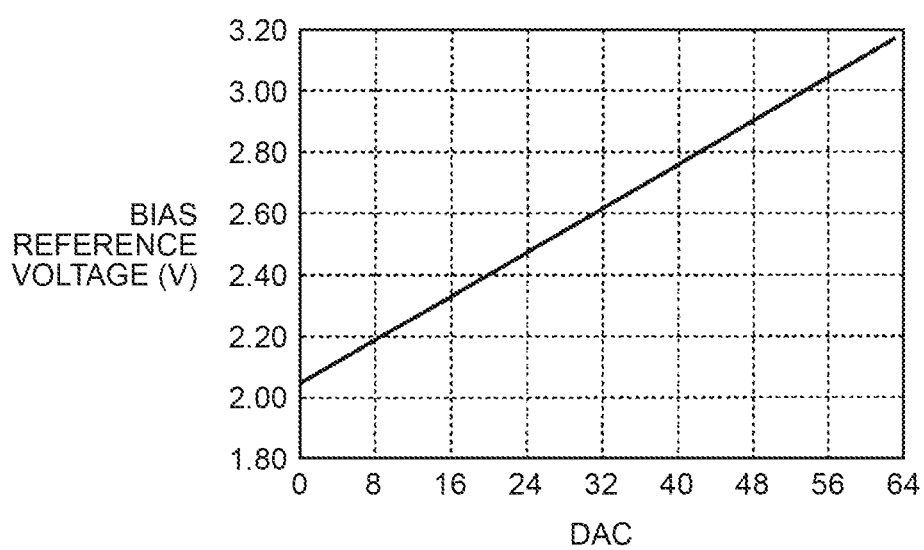
FIG. 8 is a graph illustrating a relationship between a DAC value and a bias reference voltage supplied to a bias circuit 142.

FIG. 8 is a graph illustrating a relationship between the DAC value and the bias reference voltage supplied to the bias circuit 142 (the bias reference voltage of the rear stage). As illustrated in FIG. 8, when the DAC value is in the range of 0 to 63, the bias reference voltage linearly varies between 2.05 V and 3.17 V. In this case, the bias reference voltage is controlled at intervals of about 17.5 mV.

In FIGS. 7 and 8, the bias reference voltage is controlled at intervals of about 27.0 mV and 17.5 mV. However, by narrowing the variable range of the bias reference voltage, the interval may be set to 10 mV or less.

The combinations (DAC settings) of the setting of the DAC value of the bias reference voltage of the front stage and the setting of the DAC value of the bias reference voltage of the rear stage include 64×64 combinations. Since this number of combinations is very large, only the experiment data of the characteristics of the power amplifier in some DAC settings in this specification.

The DAC settings include the following three combinations. In the first DAC setting, the DAC value of the bias reference voltage of the front stage is 40 and the DAC value of the bias reference voltage of the rear stage is 27 (40/27). In the second DAC setting, the DAC value of the bias reference voltage of the front stage is 49 and the DAC value of the bias reference voltage of the rear stage is 32 (49/32). In the third DAC setting, the DAC values of the bias reference voltages of the front stage and the rear stage are both 63 (63/63).

Figure 9:
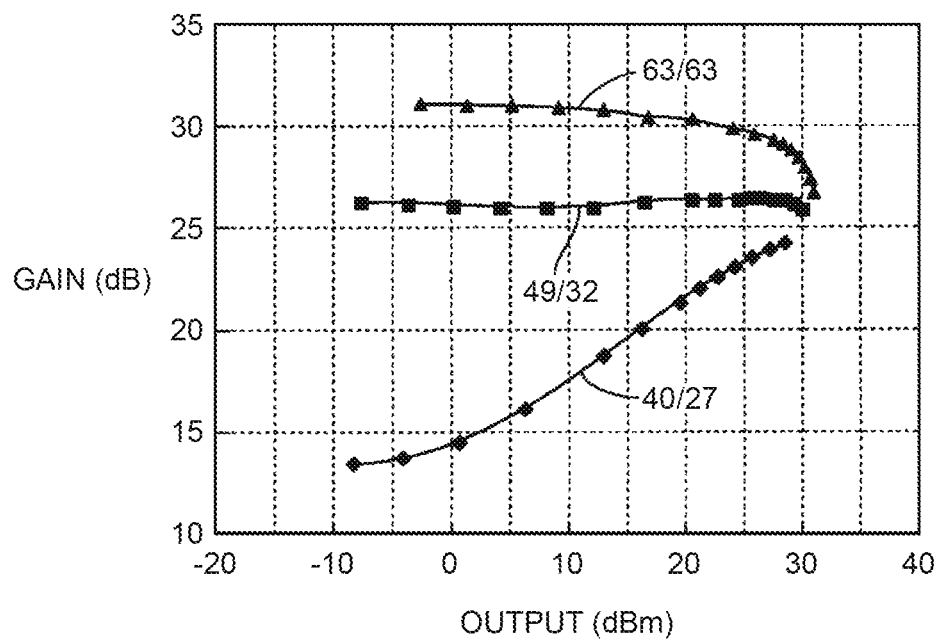
FIG. 9 is a graph illustrating a relationship between an output and a gain of a power amplifier in each DAC setting.
Figure 10:
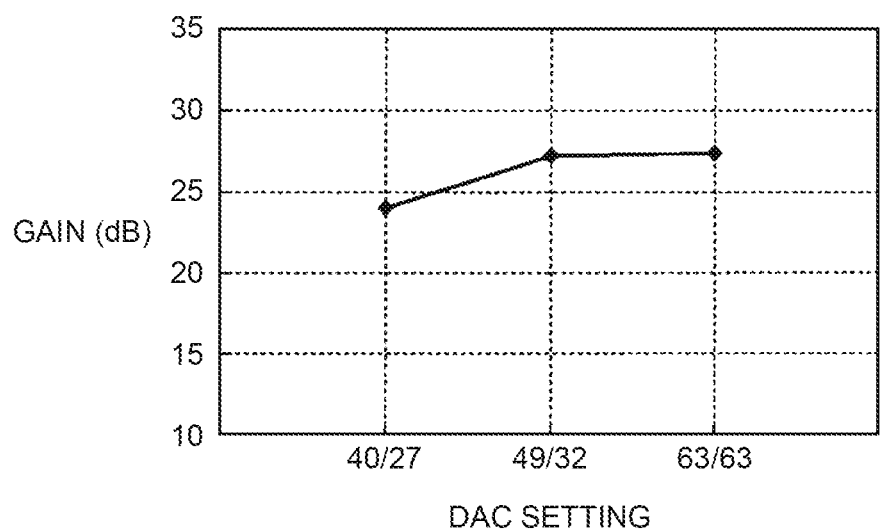
FIG. 10 is a graph illustrating a gain in each DAC setting when output power is 27.5 dBm.

FIG. 9 is a graph illustrating a relationship between the output and the gain of the power amplifier in the respective DAC settings. FIG. 10 is a graph illustrating the gains in the DAC settings when the output power is 27.5 dBm. As illustrated in FIGS. 9 and 10, it can be seen that the relationship between the output and the gain of the power amplifier varies depending on the DAC settings.

Figure 11:
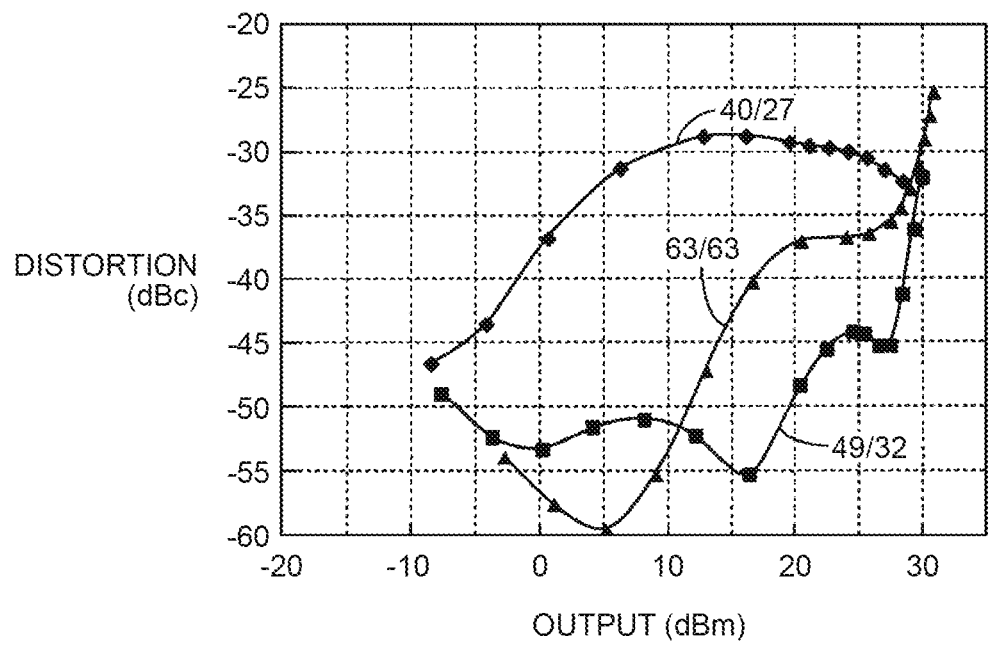
FIG. 11 is a graph illustrating a relationship between an output and a distortion of a power amplifier in each DAC setting.
Figure 12:
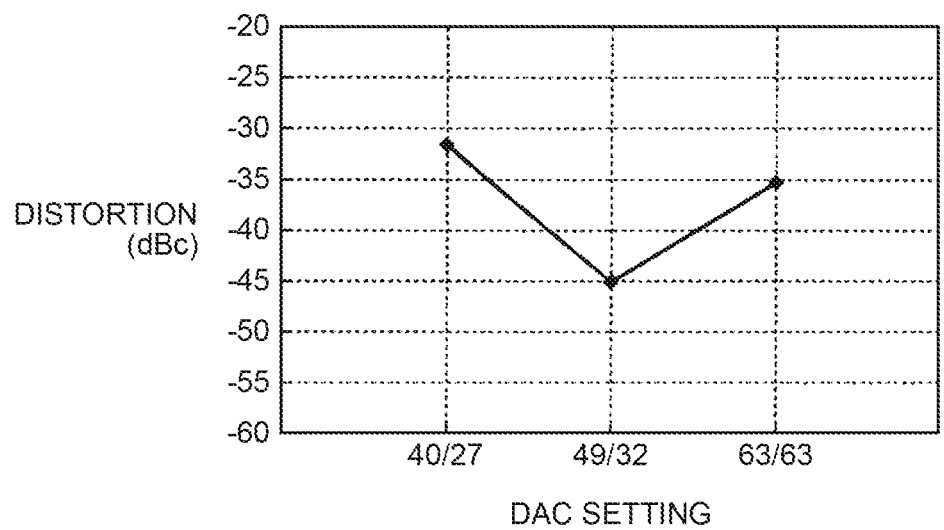
FIG. 12 is a graph illustrating a distortion in each DAC setting when output power is 27.5 dBm.

FIG. 11 is a graph illustrating a relationship between the output and the distortion of the power amplifier in the respective DAC settings. FIG. 12 is a graph illustrating the distortions in the DAC settings when the output power is 27.5 dBm. As illustrated in FIGS. 11 and 12, it can be seen that the relationship between the output and the distortion of the power amplifier varies depending on the DAC settings.

Figure 13:
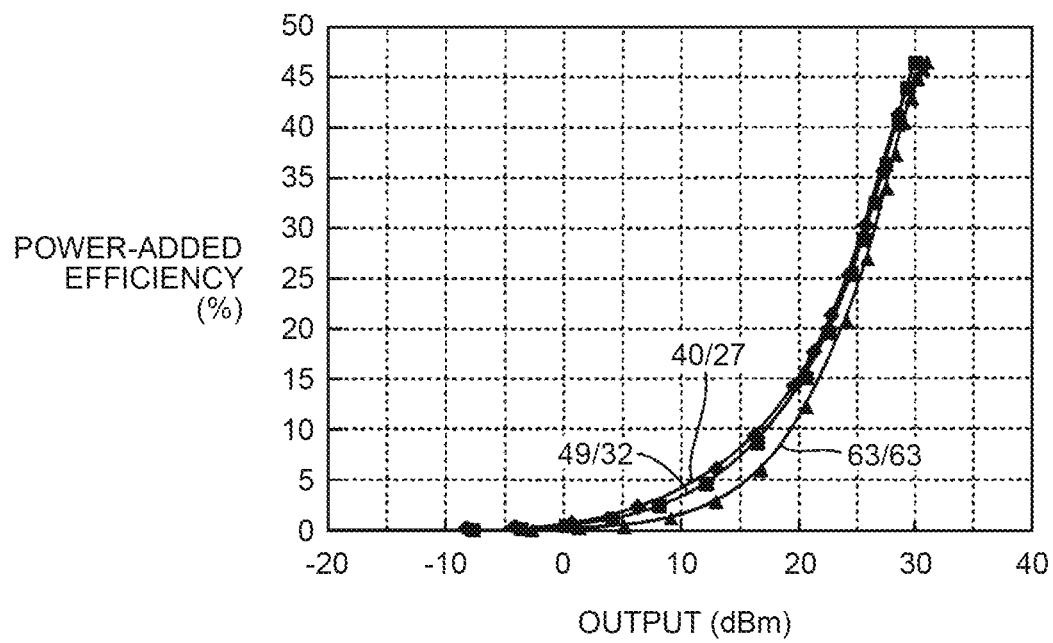
FIG. 13 is a graph illustrating a relationship between an output and a power-added efficiency of a power amplifier in each DAC setting.
Figure 14:
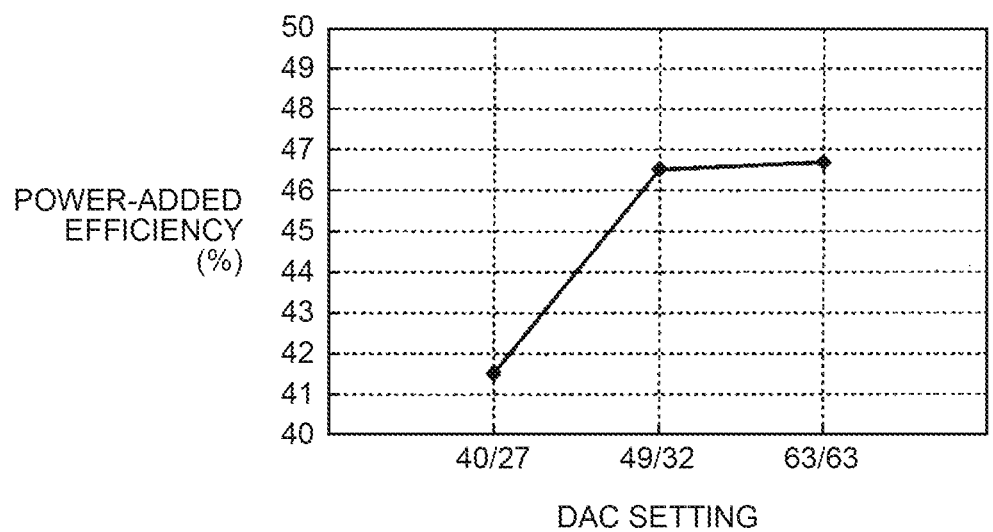
FIG. 14 is a graph illustrating a power-added efficiency in each DAC setting when output power is 27.5 dBm.

FIG. 13 is a graph illustrating a relationship between the output and the power-added efficiency of the power amplifier in the respective DAC settings. FIG. 14 is a graph illustrating the power-added efficiencies in the DAC settings when the output power is 27.5 dBm. As illustrated in FIGS. 13 and 14, it can be seen that the relationship between the output and the power-added efficiency of the power amplifier varies depending on the DAC settings.

In this way, by individually controlling the bias reference voltages of the amplifier element 111 of the front stage and the amplifier elements 112 which are illustrated in FIG. 6, it is possible to variously change the characteristics such as the gain of the power amplifier.

[Increase in Number of Bands]

Figure 15:
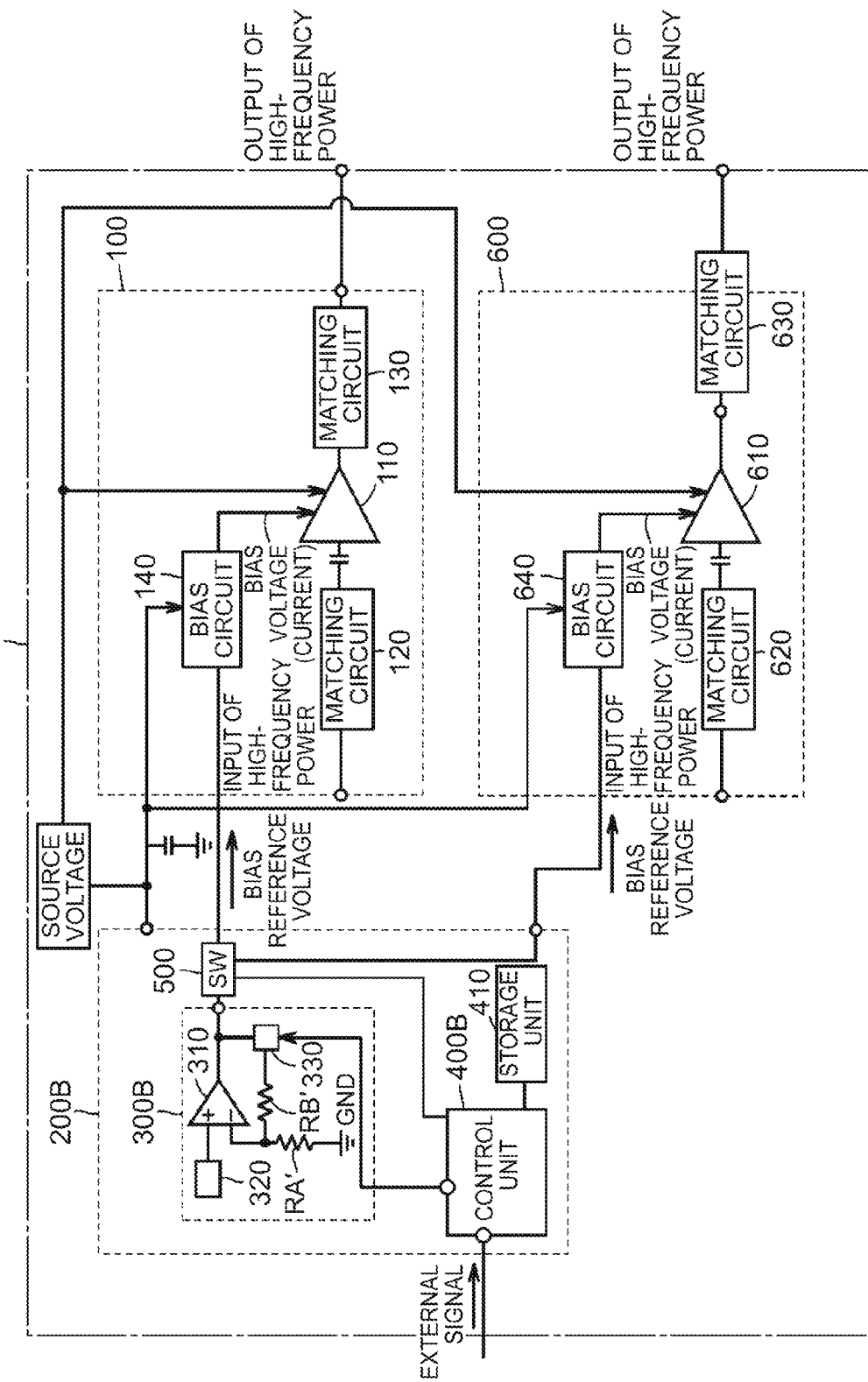
FIG. 15 is a diagram schematically illustrating a configuration of a power amplifier corresponding to plural frequency bands.

Some mobile communication terminals use plural different frequency bands. FIG. 15 is a diagram schematically illustrating a configuration of a power amplifier corresponding to plural frequency bands (multi-bands) which is used for such mobile communication terminals.

A power amplifier 10B illustrated in FIG. 15 has basically the same configuration as the power amplifier 10 illustrated in FIG. 1, except that it includes a control IC 200B, a switch 500, and a second high-frequency amplifier unit 600. The description of the same elements will not be repeated.

Referring to FIG. 15, the second high-frequency amplifier unit 600 includes an amplifier element 610 that amplifies high-frequency power, a matching circuit 620 that is disposed on the input side of the amplifier element 610, a matching circuit 630 that is disposed on the output side of the amplifier element 610, and a bias circuit 640 that supplies a bias to the amplifier element 610.

Accordingly, the second high-frequency amplifier unit 600 can optimally amplify high-frequency power in a predetermined frequency band different from that in the high-frequency amplifier unit 100. The second high-frequency amplifier unit 600 may have a multi-stage structure illustrated in FIG. 6.

The high-frequency amplifier 100 and the second high-frequency amplifier unit 600 both use the bias reference voltage from the control IC 200B.

The control IC 200B has basically the same configuration as the control IC 200A illustrated in FIG. 4 (or the control IC 200 illustrated in FIG. 1), except that it includes a switch 500. The description of the same elements will not be repeated.

The switch 500 switches a supply destination of the bias reference voltage of the bias reference voltage supply circuit 300B from the high-frequency amplifier unit 100 to the second high-frequency amplifier unit 600. In contrast, the switch 500 may switch the supply destination of the bias reference voltage from the second high-frequency amplifier unit 600 to the high-frequency amplifier unit 100.

The switching of the switch 500 may be controlled by the control unit 400 or may be controlled by a control signal (not illustrated) from the outside of the power amplifier 10B or the like.

According to this configuration, since the high-frequency amplifier unit 100 and the second high-frequency amplifier unit 600 use the control IC 200B in common, it is possible to achieve simplification in configuration, a decrease in size, and a decrease in cost of the power amplifier.

Additional high-frequency amplifier units which have the same configuration as the second high-frequency amplifier unit 600 may be added to the power amplifier 10B illustrated in FIG. 15. Accordingly, it is possible to implement a power amplifier corresponding to more frequency bands. The new high-frequency amplifier units correspond to frequency bands other than the high-frequency amplifier unit 100 and the second high-frequency amplifier unit 600.

[Temperature Compensation of Bias Reference Voltage]

An amplifier element including an HBT has temperature characteristics. A current flowing in the amplifier element tends to increase with an increase in temperature. In order to suppress the increase in current flowing in the amplifier element, it can be considered to reduce a bias voltage supplied to the amplifier element in accordance with the increase in temperature.

Accordingly, it can be considered that the voltage at the non-inverted input terminal (+) of the operational amplifier 310 illustrated in FIG. 1 decreases in accordance with the increase in temperature. When the voltage at the non-inverted input terminal (+) of the operational amplifier 310 decreases, the output voltage of the operational amplifier 310, that is, the bias reference voltage, also decreases. Accordingly, the bias voltage supplied from the bias circuit 140 to the amplifier element 110 decreases and the current flowing in the amplifier element 110 decreases.

In order to decrease the voltage at the non-inverted input terminal (+) of the operational amplifier 310 in accordance with the increase in temperature, a temperature compensating circuit to be described below can be disposed between the band-gap reference voltage supply circuit 320 and the non-inverted input terminal (+) of the operational amplifier 310.

Figure 16:
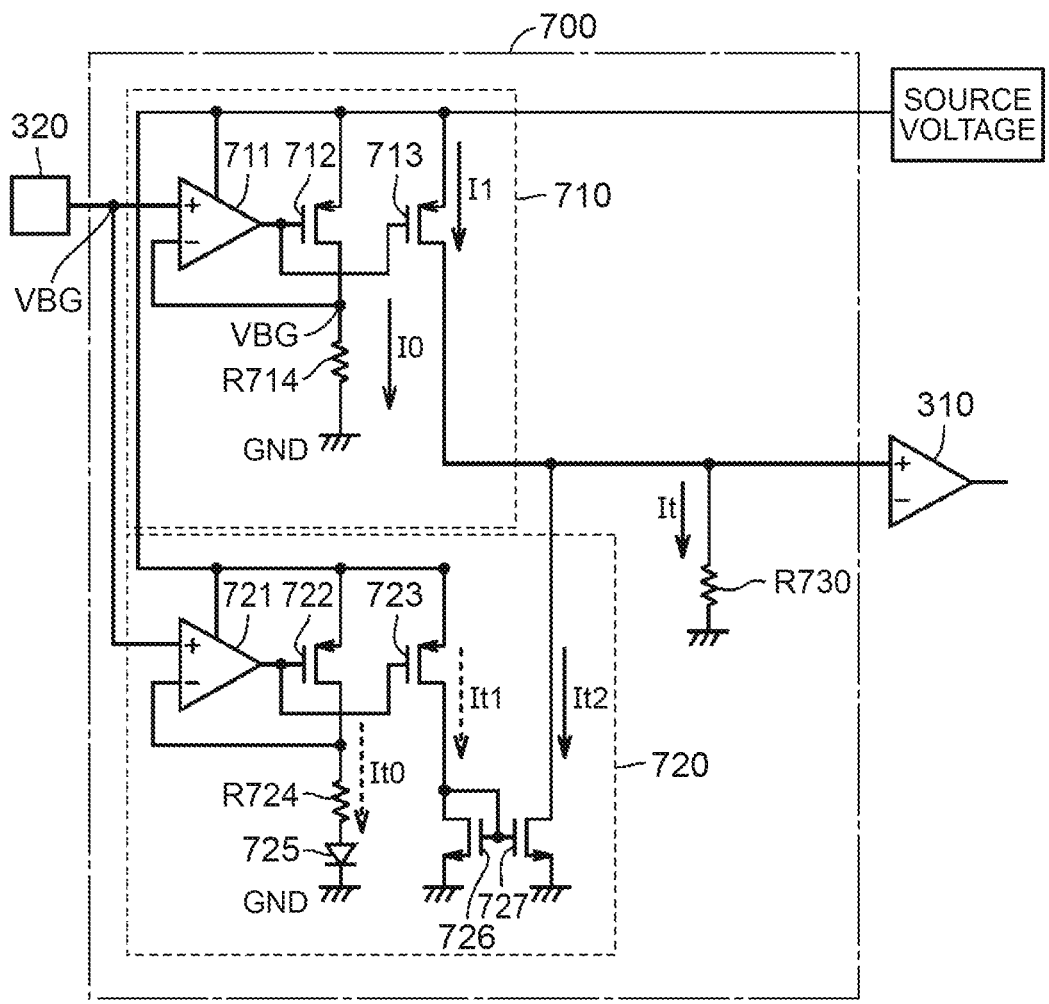
FIG. 16 is a diagram schematically illustrating a configuration of a temperature compensating circuit 700.

FIG. 16 is a diagram schematically illustrating a configuration of the temperature compensating circuit 700.

Referring to FIG. 16, the temperature compensating circuit 700 mainly includes a constant current circuit 710, a temperature-dependent current circuit 720, and an output resistor R730.

The constant current circuit 710 includes an operational amplifier 711, an FET 712, an FET 713, and a resistor R714. The non-inverted input terminal (+) of the operational amplifier 711 is supplied with a reference voltage (here, referred to as "VBG") from the band-gap reference voltage supply circuit 320. The FET 712 and the FET 713 are P-channel metal oxide semiconductor (PMOS), and the output voltage of the operational amplifier 711 is supplied to the gate terminals of FET 712 and the FET 713. The resistor R714 connects the drain terminal of the FET 712 to the ground terminal GND. The drain terminal of the FET 712 is connected to the inverted input terminal (−) of the operational amplifier 711. The drain terminal of the FET 713 is connected to an output resistor R730.

The resistor R714 is a resistor of which the resistance value does not vary depending on the temperature, or a resistor of which the resistance value varies by only a very small amount and which can be considered not to vary. Such a resistor is obtained, for example, by combining a metal resistor with a semiconductor resistor.

In the constant current circuit 710, the voltage of a node between the FET 712 and the resistor R714 is kept constant at VBG. Accordingly, the current T0 flowing in the resistor R714 (resistance value=Rx) is I0=VBG/Rx and is constant regardless of the temperature. The current I0 is also a current flowing between the source and the drain of the FET 712. On the other hand, the current I1 flowing between the source and the drain of the FET 713 depends on I0. That is, I1=k1·I0 is established, where k1 is determined on the basis of the cell size ratio of the FET 712 and the FET 713.

Accordingly, the constant current circuit 710 supplies the current I1 not dependent on the temperature to the output resistor R730.

The temperature-dependent current circuit 720 includes an operational amplifier 721, FETs 722 and 723, and a resistor R724. These elements are equal to the operational amplifier 711, the FETs 712 and 713, and the resistor R714 included in the constant current circuit 710 and thus description thereof will not be repeated herein.

In addition, the temperature-dependent current circuit 720 includes a diode 725, an FET 726, and an FET 727. The diode 725 is disposed between the resistor R724 and the ground terminal GND. The anode of the diode 725 is connected to the resistor R724 and the cathode of the diode 725 is connected to the ground terminal GND. The FET 726 and the FET 727 are N-type metal oxide semiconductor (NMOS) and constitutes a current mirror circuit having a current from the drain terminal of the FET 723 as an input current.

In the temperature-dependent current circuit 720, the current It0 flowing in the resistor R724 (resistance value=Ry) is It0=(VBG−VF)/Ry. Here, VF is a forward voltage of the diode 725. VF has temperature characteristics and VF decreases with an increase in temperature. That is, It0 increases with an increase in temperature.

The current It1 flowing between the source and the drain of the FET 723 is It1=k2·It0. Here, k2 is determined on the basis of the cell size ratio of the FET 722 and the FET 723. Accordingly, similarly to the current It0, the current It1 also increases with an increase in temperature.

The current It2 flowing between the drain and the source of the FET 727 is It2=k3·It1. Here, k3 is determined on the basis of the cell size ratio of the FET 726 and the FET 727. Accordingly, similarly to the current It0, the current It2 also increases with an increase in temperature.

The source terminal of the FET 727 is connected to the source terminal of the FET 713.

Accordingly, a part of the current I1 supplied from the constant current circuit 710 to the output resistor R730 flows as a current I2 in the FET 727.

By employing this configuration, the current It supplied to the output resistor R730 is It=I1−I2. Since I1 is a constant current but I2 increases with an increase in temperature, It decreases in an increase in temperature.

The temperature compensating circuit 700 supplies the voltage VT=It·Rz due to the flowing of the current It in the output resistor R730 (resistance value=Rz) as an output voltage to the non-inverted input terminal (+) of the operational amplifier 310. That is, the voltage supplied to the non-inverted input terminal (+) of the operational amplifier 310 decreases with an increase in temperature and thus the bias reference voltage output from the operational amplifier 310 also decreases.

Figure 17:
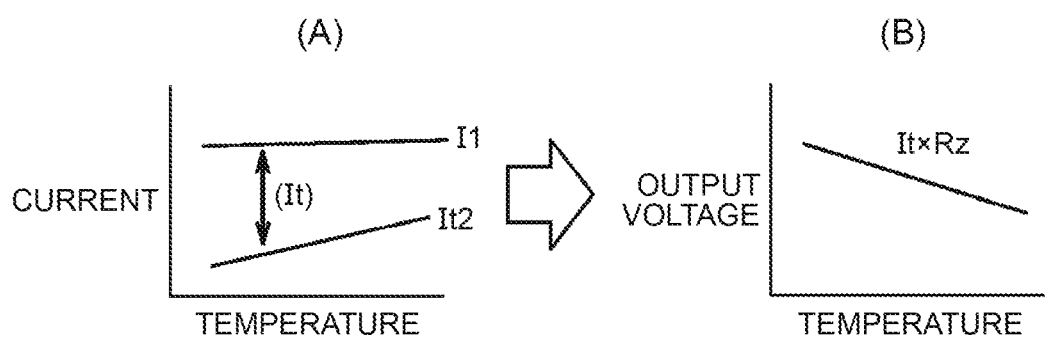
FIG. 17 is a graph illustrating a relationship among a temperature, a current and a voltage in the temperature compensating circuit 700, where (A) illustrates a relationship between a temperature and a current and (B) illustrates a relationship between a temperature and an output voltage.

FIG. 17 is a graph illustrating a relationship among the temperature, the current, and the voltage in the temperature compensating circuit 700.

As illustrated in FIG. 17(A), when the temperature increases, the current I1 is constant but the current It2 increases, whereby the current It (=I1−It2) decreases. As a result, as illustrated in FIG. 17(B), the output voltage (VT) decreases with an increase in temperature.

Finally, an embodiment of the present invention will be summarized below.

Referring to FIG. 1, an embodiment of the present invention provides a high-frequency power amplifier (10) that is used for a mobile communication terminal and that includes: an amplifier element (110) that includes a composite semiconductor bipolar transistor and that amplifies high-frequency power of a predetermined frequency band with a bias voltage and a bias current supplied thereto; a bias circuit (140) that supplies the bias voltage and the bias current to the amplifier element on the basis of a bias reference voltage; a bias reference voltage supply circuit (300) that generates and supplies the bias reference voltage to the bias circuit; and a bias reference voltage control unit (400) that controls the bias reference voltage supply circuit so as to generate the bias reference voltage of a voltage corresponding to a given signal.

Accordingly, since the bias voltages of power amplifiers can be individually set at the time of mass-producing the power amplifiers, it is possible to reduce irregularity in characteristics such as gains of the power amplifiers.

Preferably, the signal is given from the outside of the high-frequency power amplifier.

Preferably, the bias reference voltage supply circuit (300) includes an operational amplifier (310) that includes a non-inverted input terminal and an inverted input terminal and that outputs the bias reference voltage, a band-gap reference voltage supply circuit (320) that supplies the reference voltage to the non-inverted input terminal (+) of the operational amplifier (310), a first resistor (RA) as a variable resistor that connects the inverted input terminal (−) of the operational amplifier to the ground terminal (GND), and a second resistor (RB) that connects the inverted input terminal (−) of the operational amplifier (310) to the output terminal of the operational amplifier (310). The bias reference voltage control unit (400) controls the resistance value of the first resistor.

Alternatively, the bias reference voltage supply circuit (300) includes an operational amplifier (310) that includes a non-inverted input terminal and an inverted input terminal and that outputs the bias reference voltage, a band-gap reference voltage supply circuit (320) that supplies the reference voltage to the non-inverted input terminal (+) of the operational amplifier (310), a first resistor (RA) that connects the inverted input terminal (−) of the operational amplifier to the ground terminal (GND), and a second resistor (RB) as a variable resistor that connects the inverted input terminal (−) of the operational amplifier to the output terminal of the operational amplifier. The bias reference voltage control unit (400) controls the resistance value of the second resistor (RB).

Preferably, as illustrated in FIGS. 4 and 5, the bias reference voltage supply circuit (300A) further includes plural resistors (R1 to Rn) that are disposed between the output terminal of the operational amplifier (310) and the second resistor (RB) and that are connected in series to each other and plural bypass switches (FET1 to FETn) that are connected in parallel to the plural resistors (R1 to Rn). The bias reference voltage control unit (400A) individually controls the plural bypass switches (FET1 to FETn).

More preferably, the resistance values of the plural resistors (R1 to Rn) are determined on the basis of a geometric series.

Preferably, as illustrated in FIG. 6, the high-frequency power amplifier includes plural amplification stages. Each amplification stage includes an amplifier element (111 or 112), a bias circuit (141 or 142), and a bias reference voltage supply circuit (301 or 302).

Preferably, as illustrated in FIG. 15, the high-frequency power amplifier (10B) further includes a second amplifier element (610) that includes a composite semiconductor bipolar transistor and that amplifies high-frequency power of a second frequency band different from the predetermined frequency band with a second bias voltage and a second bias current supplied thereto, a second bias circuit (640) that supplies the second bias voltage and the second bias current to the second amplifier element on the basis of a bias reference voltage, and a switch (500) that switches a supply destination of the bias reference voltage generated by the bias reference voltage supply circuit (300B) from the bias circuit (140) to the second bias circuit (640).

More preferably, the high-frequency power amplifier includes plural second amplification stages. Each second amplification stage includes the second amplifier element and the second bias circuit.

Preferably, as illustrated in FIG. 16, the bias reference voltage supply circuit further includes a temperature compensating circuit (700) that decreases the reference voltage with an increase in temperature.

Preferably, as illustrated in FIG. 1, the high-frequency power amplifier (10) further includes a storage unit (410) that stores data in which the bias reference voltage is correlated with the gain of the high-frequency power amplifier (10) in advance. The bias reference voltage control unit (400) controls the bias reference voltage supply circuit (300) with the data stored in the storage unit (410) received as the signal.

The embodiment described herein is only an example and is not considered to limit the present invention. The scope of the present invention is defined by the appended claims, not the above-mentioned embodiment, and includes all modifications within the meaning and scope equivalent to the claims.

DESCRIPTION OF REFERENCE NUMERALS 10, 10A, 10B power amplifier
12, 140, 141, 142, 640 bias circuit
100 high-frequency amplifier unit
110, 111, 112, 610 amplifier element
113, 114, 115, 120, 130, 620, 630 matching circuit
300, 300A, 301, 302 bias reference voltage supply circuit
310, 711, 721 operational amplifier
320 band-gap reference voltage supply circuit
330 resistor circuit
400, 400A control unit
410 storage unit
500 switch
600 second high-frequency amplifier unit
700 temperature compensating circuit
710 constant current circuit
720 temperature-dependent current circuit
725 diode
GND ground terminal
200, 200B, 200A control IC
R1, R2, R714, R724, RA, RB, Rn resistor
R730 output resistor

What is claimed is:

1. A high-frequency power amplifier that is used for a mobile communication terminal and that comprises:
   an amplifier element including a composite semiconductor bipolar transistor and configured to amplify high-frequency power of a predetermined frequency band with a bias voltage and a bias current supplied thereto;
   a bias circuit configured to supply the bias voltage and the bias current to the amplifier element on the basis of a bias reference voltage;
   a bias reference voltage supply circuit configured to generate and supply the bias reference voltage to the bias circuit;
   a bias reference voltage control unit configured to control the bias reference voltage supply circuit so as to generate the bias reference voltage of a voltage corresponding to a given signal; and
   a storage unit configured to store data in which the bias reference voltage and a gain of the high-frequency power amplifier are correlated with each other in advance,
   wherein the bias reference voltage control unit is configured to control the bias reference voltage supply circuit with the data stored in the storage unit supplied thereto as the signal.

2. The high-frequency power amplifier according to claim 1, wherein the signal is given from the outside of the high-frequency power amplifier.

3. The high-frequency power amplifier according to claim 1, wherein the bias reference voltage supply circuit includes:
   an operational amplifier having a non-inverted input terminal and an inverted input terminal and configured to output the bias reference voltage;
   a band-gap reference voltage supply circuit configured to supply a reference voltage to the non-inverted input terminal of the operational amplifier;
   a first resistor as a variable resistor connecting the inverted input terminal of the operational amplifier to a ground terminal; and
   a second resistor connecting the inverted input terminal of the operational amplifier to an output terminal of the operational amplifier,
   wherein the bias reference voltage control unit is configured to control a resistance value of the first resistor.

4. The high-frequency power amplifier according to claim 1, wherein the bias reference voltage supply circuit includes:
   an operational amplifier having a non-inverted input terminal and an inverted input terminal and configured to output the bias reference voltage;
   a band-gap reference voltage supply circuit configured to supply a reference voltage to the non-inverted input terminal of the operational amplifier;
   a first resistor connecting the inverted input terminal of the operational amplifier to a ground terminal; and
   a second resistor as a variable resistor connecting the inverted input terminal of the operational amplifier to an output terminal of the operational amplifier,
   wherein the bias reference voltage control unit is configured to control a resistance value of the second resistor.

5. The high-frequency power amplifier according to claim 4, wherein the bias reference voltage supply circuit further includes:

a plurality of resistors disposed in series between the output terminal of the operational amplifier and the second resistor; and a plurality of bypass switches connected in parallel to the plurality of resistors, respectively, wherein the bias reference voltage control unit configured to individually control the plurality of bypass switches.

6. The high-frequency power amplifier according to claim 5, wherein the resistance value of each of the plurality of resistors is determined on the basis of a geometric series.

7. The high-frequency power amplifier according to claim 1, wherein the high-frequency power amplifier has a plurality of amplification stages, and wherein each of the plurality of amplification stages includes:

the amplifier element;

the bias circuit; and the bias reference voltage supply circuit.

8. The high-frequency power amplifier according to claim 1, further comprising:

a second amplifier element including a composite semiconductor bipolar transistor and configured to amplify high-frequency power of a second frequency band different from the predetermined frequency band with a second bias voltage and a second bias current supplied thereto;

a second bias circuit configured to supply the second bias voltage and the second bias current to the second amplifier element on the basis of a bias reference voltage; and a switch configured to switch a supply destination of the bias reference voltage generated by the bias reference voltage supply circuit from the bias circuit to the second bias circuit.

9. The high-frequency power amplifier according to claim 8, wherein the high-frequency power amplifier has a plurality of second amplification stages, and wherein each of the plurality of second amplification stages includes:

the second amplifier circuit; and the second bias circuit.

10. The high-frequency power amplifier according to claim 3, wherein the bias reference voltage supply circuit further includes a temperature compensating circuit configured to decrease the reference voltage with an increase in temperature.

11. The high-frequency power amplifier according to claim 5, wherein the plurality of bypass switches are field effect transistors.

12. The high-frequency power amplifier according to claim 6, wherein the geometric series has a geometric ratio of 2.

13. The high-frequency power amplifier according to claim 1, wherein the bias reference voltage control unit is configured to control the bias reference voltage supply circuit with six bits.

14. The high-frequency power amplifier according to claim 5, wherein the number of the plurality of resistors disposed in series between the output terminal of the operational amplifier and the second resistor is equal to a number of bits of the bias reference voltage control unit.

15. The high-frequency power amplifier according to claim 1, wherein the bias reference voltage control unit is configured to control the bias reference voltage at intervals of less than 10mV.

16. The high-frequency power amplifier according to claim 2, wherein the bias reference voltage supply circuit includes:

an operational amplifier having a non-inverted input terminal and an inverted input terminal and configured to output the bias reference voltage;

a band-gap reference voltage supply circuit configured to supply a reference voltage to the non-inverted input terminal of the operational amplifier;

a first resistor as a variable resistor connecting the inverted input terminal of the operational amplifier to a ground terminal; and a second resistor connecting the inverted input terminal of the operational amplifier to an output terminal of the operational amplifier, wherein the bias reference voltage control unit is configured to control a resistance value of the first resistor.

17. The high-frequency power amplifier according to claim 16, wherein the bias reference voltage supply circuit further includes a temperature compensating circuit configured to decrease the reference voltage with an increase in temperature.

18. The high-frequency power amplifier according to claim 2, wherein the bias reference voltage supply circuit includes:

an operational amplifier having a non-inverted input terminal and an inverted input terminal and configured to output the bias reference voltage;

a band-gap reference voltage supply circuit configured to supply a reference voltage to the non-inverted input terminal of the operational amplifier;

a first resistor connecting the inverted input terminal of the operational amplifier to a ground terminal; and a second resistor as a variable resistor connecting the inverted input terminal of the operational amplifier to an output terminal of the operational amplifier, wherein the bias reference voltage control unit is configured to control a resistance value of the second resistor.

19. The high-frequency power amplifier according to claim 18, wherein the bias reference voltage supply circuit further includes a temperature compensating circuit configured to decrease the reference voltage with an increase in temperature.

\* \* \* \* \*

UNITED STATES PATENT AND TRADEMARK OFFICE
CERTIFICATE OF CORRECTION

PATENT NO. : 9,344,044 B2  
APPLICATION NO. : 14/451506  
DATED : May 17, 2016  
INVENTOR(S) : Yasunobo Yoshizaki Page 1 of 1

It is certified that error appears in the above-identified patent and that said Letters Patent is hereby corrected as shown below:

In the specification:

Column 9, line 14: please delete "TO" and replace it with -- I0 --

Signed and Sealed this
Twenty-third Day of August, 2016

Michelle K. Lee
*Director of the United States Patent and Trademark Office*